(12) United States Patent
Higa

(10) Patent No.: US 11,979,168 B2
(45) Date of Patent: May 7, 2024

(54) METHOD FOR IMPROVING PERFORMANCE OF A SUPERCONDUCTING, FLUX-QUANTIZING ANALOG TO DIGITAL CONVERTER

(71) Applicant: United States of America as represented by the Secretary of the Navy, San Diego, CA (US)

(72) Inventor: Brian A. Higa, San Diego, CA (US)

(73) Assignee: United States of America represented by the Secretary of the Navy, Washington, DC (US)

( * ) Notice: Subject to any disclaimer, the term of this patent is extended or adjusted under 35 U.S.C. 154(b) by 161 days.

(21) Appl. No.: 17/890,585

(22) Filed: Aug. 18, 2022

(65) Prior Publication Data

US 2024/0063806 A1 Feb. 22, 2024

(51) Int. Cl.
| | | |
|---|---|---|
| H03M 1/72 | (2006.01) | |
| H03M 1/10 | (2006.01) | |
| H03M 1/00 | (2006.01) | |
| H03M 1/12 | (2006.01) | |
| H03M 3/00 | (2006.01) | |
| H03M 3/02 | (2006.01) | |

(52) U.S. Cl.
CPC ............ H03M 1/1014 (2013.01); *H03M 1/00* (2013.01); *H03M 1/12* (2013.01); *H03M 3/00* (2013.01); *H03M 3/02* (2013.01)

(58) Field of Classification Search
CPC ........ H03M 1/1014; H03M 1/00; H03M 1/12; H03M 3/00; H03M 3/02
See application file for complete search history.

(56) References Cited

U.S. PATENT DOCUMENTS

2002/0060635 A1\* 5/2002 Gupta ..................... H03M 1/14
341/133

OTHER PUBLICATIONS

Shrestha Bansal et al.; Black-Box Optimization of Superconducting Circuits using Reduced-Complexity Neural Networks; DOI 10.1109/TASC.2021.3061338, IEEE Transactions on Applied Superconductivity; 2021.

\* cited by examiner

*Primary Examiner* — Joseph J Lauture
(74) *Attorney, Agent, or Firm* — Naval Information Warfare Center, Pacific; Kyle Eppele; J. Eric Anderson

(57) ABSTRACT

A method for improving performance of a superconducting, flux-quantizing analog to digital converter (SFADC), comprising the following steps. The first step involves providing a known digitally-modulated signal as an input to the SFADC. Another step provides for generating an output with the SFADC based on the known digitally-modulated signal. Another step provides for comparing the characteristics of the output with ideal characteristics to identify an individual rapid single flux quantum (RSFQ) element of the SFADC that is contributing one or more of noise and error to the output. Another step provides for altering one or more of a bias, a delay, and a temperature of the individual RSFQ element to reduce one or more of the noise and the error.

20 Claims, 3 Drawing Sheets

METHOD FOR IMPROVING
PERFORMANCE OF A SUPERCONDUCTING,
FLUX-QUANTIZING ANALOG TO DIGITAL
CONVERTER

FEDERALLY-SPONSORED RESEARCH AND
DEVELOPMENT

The United States Government has ownership rights in this invention. Licensing and technical inquiries may be directed to the Office of Research and Technical Applications, Naval Information Warfare Center Pacific, Code 72120, San Diego, CA, 92152; voice (619) 553-5118; ssc_pac_t2@navy.mil. Reference Navy Case Number 113674.

BACKGROUND OF THE INVENTION

A superconducting, flux-quantizing analog to digital converter (SFADC) is an esoteric type of ADC that operates differently compared to conventional ADCs. Unlike conventional ADCs, an SFADC operates using rapid single flux quantum (RSFQ) elements, which convert an input signal into a train of pulses. The development of RSFQ elements has gone through improvements in time such as increasing the critical current density and reducing cross-talk between adjacent RSFQ elements. These improvements adjust biases and parameters as the ADC is being designed and fabricated. However, there exists a need to improve performance of a given SFADC after it has been manufactured.

SUMMARY

Disclosed herein is a method for improving performance of a SFADC that comprises, consists of, or consists essentially of the following steps. The first step involves providing a known digitally-modulated signal as an input to the SFADC. The next step provides for generating an output with the SFADC based on the known digitally-modulated signal. The next step provides for comparing the characteristics of the output with ideal characteristics to identify an individual RSFQ element of the SFADC that is contributing one or more of noise and error to the output. Another step provides for altering one or more of a bias, a delay, and a temperature of the individual RSFQ element to reduce one or more of the noise and the error.

Another embodiment of the method for improving performance of a SFADC is described herein that comprises, consists of, or consists essentially of the following steps. The first step involves providing a digital waveform test signal as an input to the SFADC at an input terminal. Another step provides for demodulating the digital waveform test signal with the SFADC so as to produce an output signal. Another step provides for using digital signal processing techniques to identify any errors or noise in the output signal due to internal components of the SFADC. Another step provides for altering one or more of a bias, a delay, and a temperature of a given internal component of the SFADC to calibrate the given internal component to reduce one or more of the noise and the error in the output signal.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed methods below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
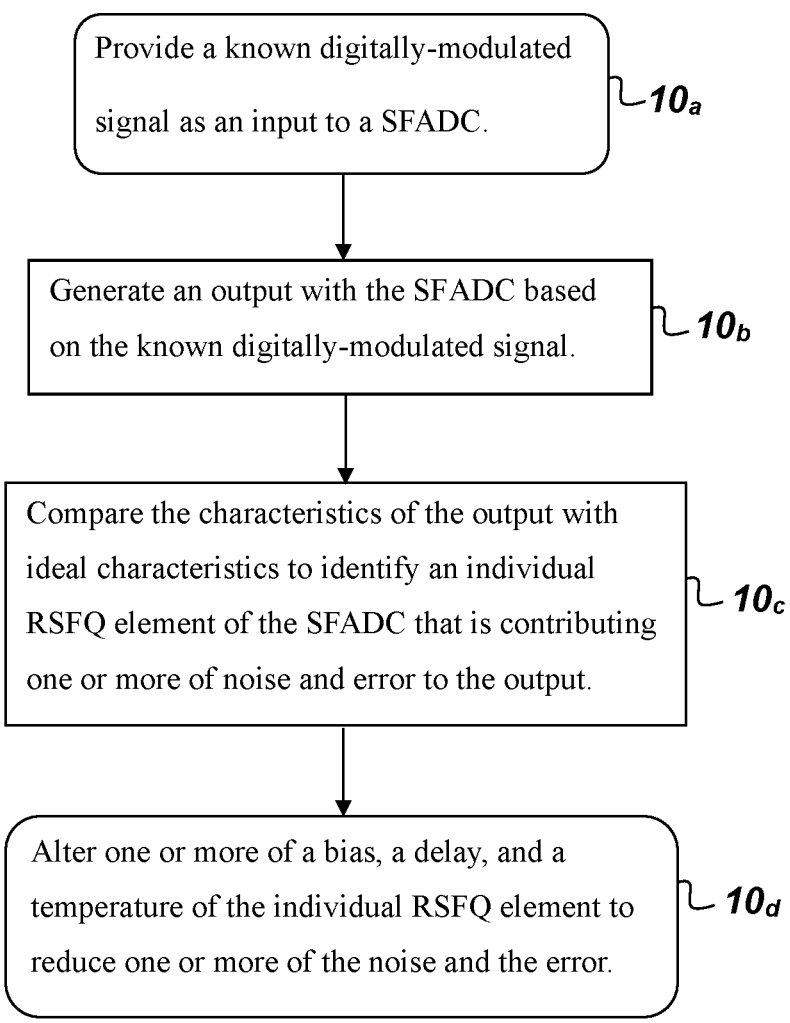
FIG. 1 is a flowchart of a method for improving performance of an SFADC.

FIG. 1 is a flowchart of a method 10 for improving performance of a SFADC that comprises, consists of, or consists essentially of the following steps. The first step 10a involves providing a known digitally-modulated signal as an input to the SFADC. The next step 10b provides for generating an output with the SFADC based on the known digitally-modulated signal. The next step 10c provides for comparing the characteristics of the output with ideal characteristics to identify an individual RSFQ element, or another internal component, of the SFADC that is contributing one or more of noise and error to the output. Another step 10d provides for altering one or more of a bias, a delay, and a temperature of the individual RSFQ element to reduce one or more of the noise and the error. For example, bit errors occurring at almost constant time intervals in a demodulated SFADC output of a digital waveform can be caused by a problem in an internal counter RSFQ element. In order to correct the bit errors, one may adjust one or more of the bias and delay lines of the counter RSFQ element such that a bit error of the SFADC is corrected for a given input. In another example, if phase drift is detected at an output of the SFADC, the drift can be addressed by adjusting one or more of a bias and a temperature of a phase comparator RSFQ element thereby adjusting the phase comparator RSFQ element's comparison threshold for the desired input.

Method 10 may be used to digitally optimize signal collection for SFADCs through error correction and noise reduction techniques in digital signal processing thereby improving performance and increasing sensitivity of a given SFADC after it has been manufactured. When the RSFQ elements convert an input signal into a train of pulses, the phase of the pulse train is linearly dependent on the input and carries the signal information that is phase demodulated into multi-bit code by the SFADC. Imperfections and errors in the output signal are not ambiguous and can be traced to specific components of the SFADC. Once identified, calibration can be applied by adjusting component parameters that affect noise and errors at the SFADC output. This may not be successful across the entire frequency range of the SFADC, but it can focus on narrow frequency bands that are of high interest. This calibration that results in improving performance of an existing SFADC after its design and fabrication may be done manually or with the assistance of a computer.

Figure 2:
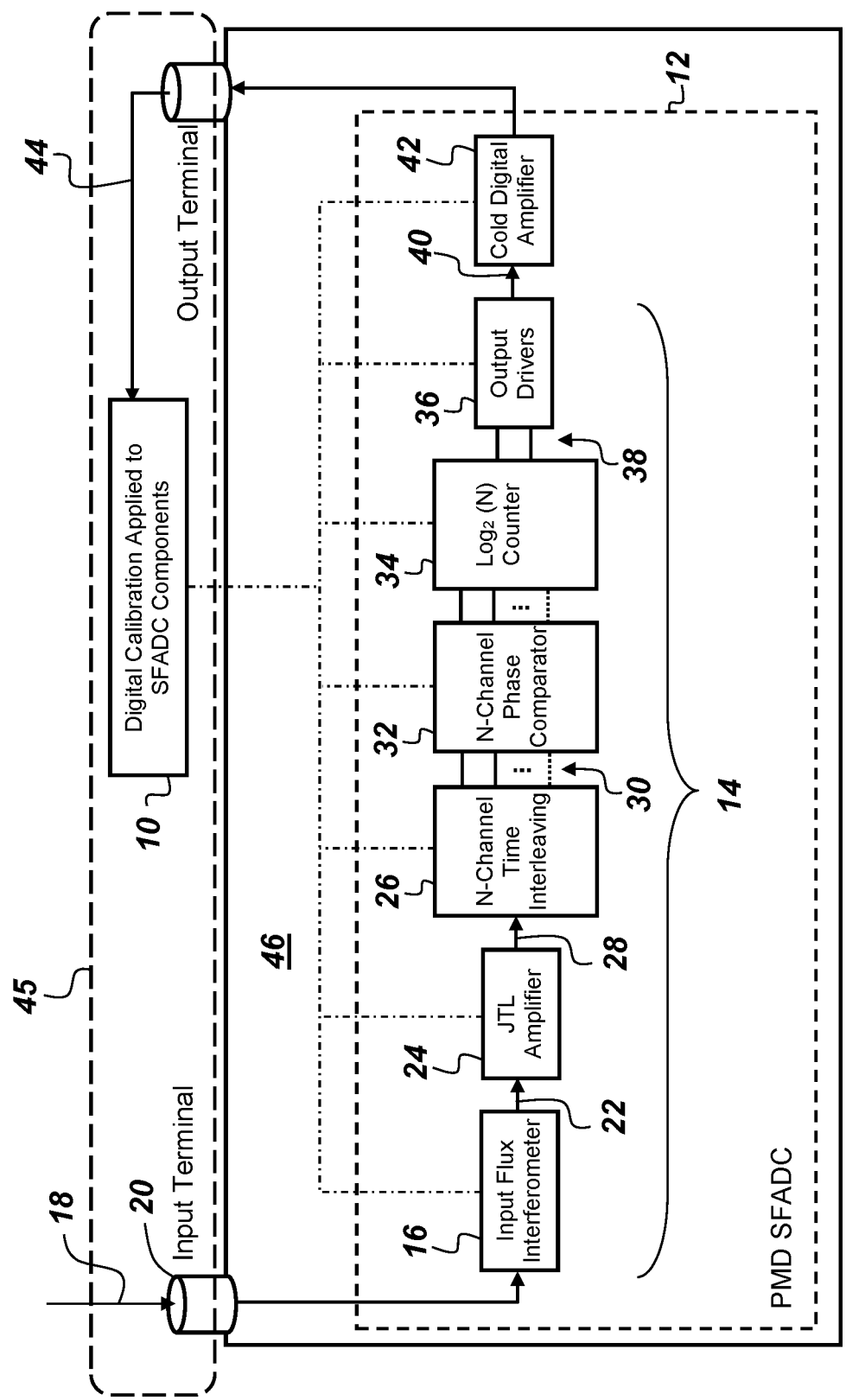
FIG. 2 is a block diagram of an example embodiment of an SFADC.

FIG. 2 is a block diagram illustrating an example embodiment of an example SFADC 12, the performance of which may be improved by method 10. The example SFADC 12 shown in FIG. 2 is a phase-modulation-demodulation (PMD) ADC that comprises six RSFQ elements 14 as described below. However, it is to be understood that method 10 is not limited to use with PMD SFADCs, but may be used with any SFADC. One of the RSFQ elements 14 shown in FIG. 2 is an input flux interferometer 16 configured to convert an input current signal 18 (also referred to herein as a digital waveform signal) that is provided to an input terminal 20 into single flux quantum (SFQ) pulses 22. A Josephson transmission line amplifier 24 is configured to buffer and condition the SFQ pulses 22. An N-channel time interleaving element 26 is configured to copy the buffered and conditioned SFQ pulses 28 into N number of channels 30 with each channel 30 having an integer-multiple time delay from each other that creates time interleaving. An N-channel phase comparator 32 is configured to measure a phase of the SFQ pulses in each channel 30, and further configured to perform phase demodulation and to recover digital information from the SFQ pulses in each channel 30. A $\log_2(N)$ counter 34 is configured to compress the digital information into less than N channels. An output driver 36 is configured to convert the compressed digital information 38 into output voltages 40.

SFADCs use Josephson junctions (JJs) for digitization. JJs store and transfer information in the form of single flux quantum (SFQ) pulses. The duration of the pulses represents the information in JJs and they are the building blocks that form RSFQ elements. These elements perform functions such as amplification, energy conversion, phase shifting, Boolean logic, and memory. Referring back to FIG. 2, the SFADC 12 also includes a cold digital amplifier 42, which is not an RFSQ element 14, but is configured to buffer and condition the output voltage 40 to create an output signal 44 that may be used with room temperature electronics. The dotted-line box 45 surrounds functions that may be performed at room temperature. These seven aforementioned components are intended to operate in cryogenic temperatures and are shown as being housed in a cryogenic enclosure 46, such as a cryostat. The SFADC's internal components (i.e., the RSFQ elements 14) and the cold digital amplifier 42 have specific functions and can create/add noise that may ultimately affect SFADC output and limit its performance. If the cold digital amplifier 42 is determined to be a source of error or noise or both, one may alter one or more of a bias, a delay, and a temperature of the cold digital amplifier. The temperature of an individual RSFQ element 14 or the cold digital amplifier 42 may be altered by heaters in the form of resistors, which may be located throughout the SFADC chip. Changing the current applied to the resistors changes the local temperature of the heaters and neighboring internal components of the SFADC. The currents can be controlled by digital signal processing calibration from room temperature. The actual temperature of individual RSFQ elements 14 do not need to be measured. Digital signal processing calibration may be used to adjust the currents until the errors and noise are minimized in the SFADC output 44. The RSFQ elements 14 realistically cannot be ideal because of design implementation challenges and fabrication imperfections. These challenges and imperfections manifest into errors and noise at the SFADC output 44 and affect sensitivity, bit error rate, and noise floor.

Figure 3:
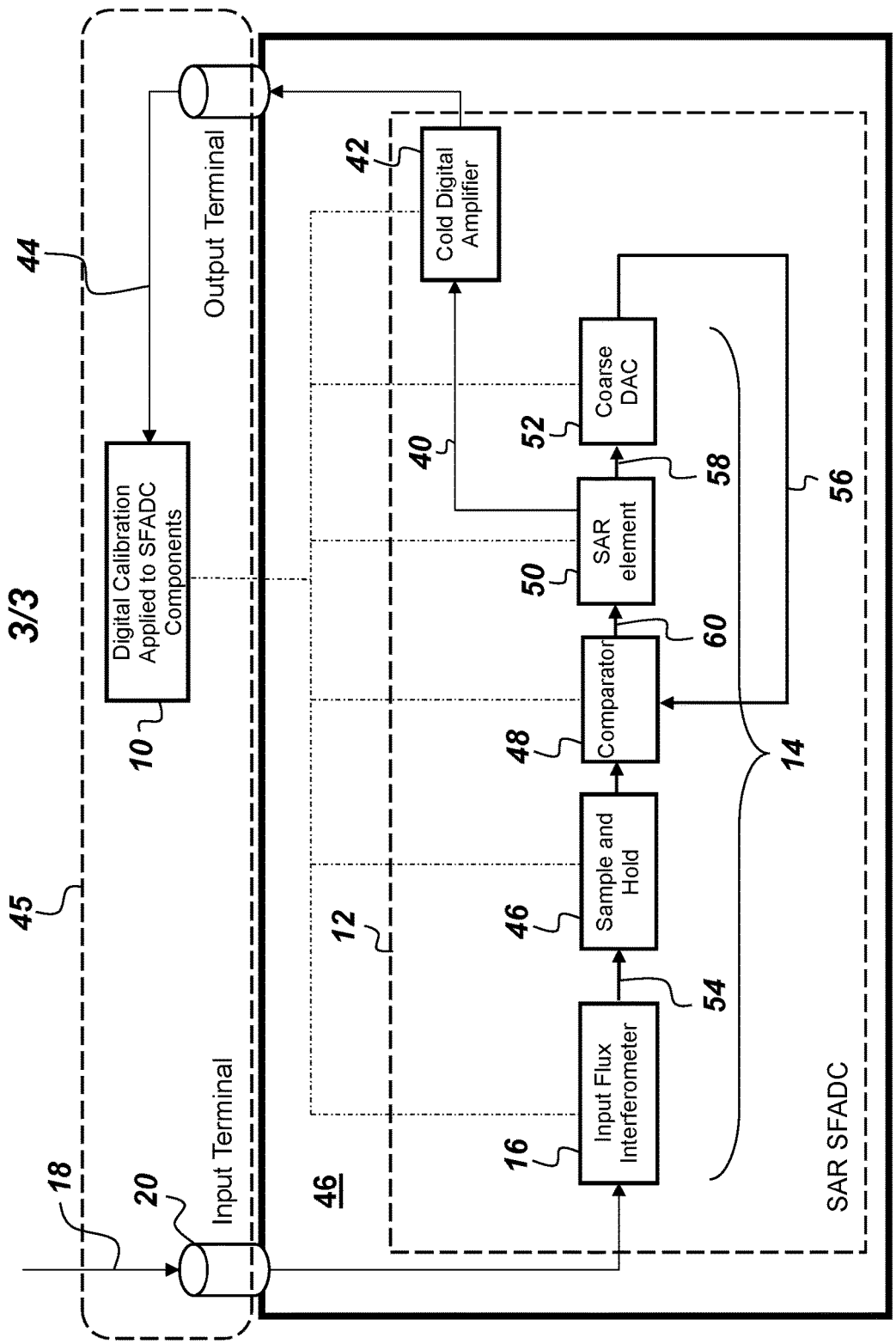
FIG. 3 is a block diagram of an example embodiment of an SFADC.

Method 10 enables improvements to the performance of an SFADC that can be made outside of design and fabrication. Errors and noise at the SFADC output can be traced back to specific components in the SFADC structure and the components can be calibrated to minimize errors and noise. Embodiments of method 10 may employ digital signal processing techniques to identify errors and noise and then to calibrate the internal SFADC components. The operation of method 10 is shown in FIGS. 2 and 3 as the feedback loop of "'Digital Optimization Applied to SFADC components." For example, embodiments of method 10 may include the step of performing fast Fourier transform (FFT) of the output and then using the FFT to analyze a power spectrum density (PSD) of the SFADC output to determine if certain internal components of the SFADC have mismatch or errors that appear as one or more of noise and harmonic spurs in the FFT. Then, if the SFADC output is nonlinear for input power multiples, embodiments of method 10 may include the step of identifying either the N-channel time interleaving element or the N-channel phase comparator as an element contributing noise to the SFADC output. Calibration can be applied by adjusting the biases of the offending RSFQ elements to compensate for mismatch and errors. The results can be observed in the PSD. If the SFADC output has harmonics that are fraction multiples of a sampling frequency, the harmonics can be traced to the output driver 36 or the cold digital amplifier 42. Corresponding calibration can be applied. Other noise reduction and error correction techniques in digital signal processing can be applied similarly. The SFADC 12 may be considered optimized when all its internal components are calibrated and noise and spurs are minimized.

The digital signal analysis on a digital waveform test signal that is input and demodulated by the SFADC results in calibration and diagnoses according to method 10 that are otherwise unavailable on analog and digital circuits on chips operating at cryogenic temperature. This is because probing and monitoring individual RSFQ elements on the chip is not feasible due to the limited number of contact points permitted inside the cryogenic chamber and each contact point would also create a thermal path between the cryogenically cooled chip and room temperature, which would affect the temperature gradient of the chip. Method 10 allows for calibration and diagnoses of the individual RSFQ elements without adding additional probes and monitors.

FIG. 3 is a block diagram of another example of an SFADC 12 that may have its performance improved by method 10. The SFADC 12 shown in FIG. 3 is a successive approximation register (SAR) SFADC that comprises an embodiment of the cold digital amplifier 42 and five RSFQ elements 12: an input flux interferometer 16, a sample and hold element 46, a comparator 48, a SAR element 50, and a coarse digital to analog converter (DAC) 52. As with the embodiment of the SDARC 12 shown in FIG. 2, in the embodiment shown in FIG. 3, the input flux interferometer 16 is configured to convert the input current signal 18 into SFQ pulses 54. The sample and hold element 46 is configured to sample input SFQ pulse values 54 and hold the sampled input SFQ pulse values for more than two clock cycles. The comparator 48 is configured to measure a difference between the input SFQ pulses 54 and reference SFQ pulses 56. The SAR element 50 is configured to estimate an analog input signal 58 based on an output 60 of the comparator 48 and store the estimated analog input signal 58 in digital format. The SAR element 50 also is configured to convert the compressed digital information into output voltages 40. The coarse DAC element 52 is configured to convert the stored, digitally-formatted estimate of the analog input signal 58 from the SAR element 50 into the reference SFQ pulses 56. The digital signal processing step of method 10 may be performed at room temperature without establishing separate physical connection, apart from the input terminal, to individual internal components of the SFADC 12 while maintaining the SFADC 12 at cryogenic temperatures.

Still referring to FIG. 3, the SFADC 12 in this embodiment also includes a cold digital amplifier 42, which is configured to buffer and condition the output voltage 40 to create an output signal 44 that may be used with room temperature electronics. As with FIG. 2, the dotted-line box 45 surrounds functions that may be performed at room temperature. The six SFADC components shown in FIG. 3 are intended to operate in cryogenic temperatures and are shown as being housed in a cryogenic enclosure 46.

From the above description of the method 10 for improving performance of an SFADC, it is manifest that various techniques may be used for implementing the concepts of method 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that method 10 is not limited to the particular embodiments described herein, but is capable of many embodiments without departing from the scope of the claims.

I claim:

1. A method for improving performance of a superconducting, flux-quantizing analog to digital converter (SFADC), comprising the following steps:
   providing a known digitally-modulated signal as an input to the SFADC;
   generating an output with the SFADC based on the known digitally-modulated signal;
   comparing the characteristics of the output with ideal characteristics to identify an individual rapid single flux quantum (RSFQ) element of the SFADC that is contributing one or more of noise and error to the output; and
   altering one or more of a bias, a delay, and a temperature of the individual RSFQ element to reduce one or more of the noise and the error.

2. The method of claim 1, wherein the SFADC is a phase-modulation-demodulation (PMD) ADC that comprises six RSFQ elements as follows:
   an input flux interferometer configured to convert an input current signal into single flux quantum (SFQ) pulses;
   a Josephson transmission line amplifier configured to buffer and condition the SFQ pulses;
   an N-channel time interleaving element configured to copy the buffered and conditioned SFQ pulses into N number of channels with each channel having an integer-multiple time delay from each other that creates time interleaving;
   an N-channel phase comparator configured to measure a phase of the SFQ pulses in each channel, and further configured to perform phase demodulation and to recover digital information from the SFQ pulses in each channel;
   a $\log_2(N)$ counter configured to compress the digital information into less than N channels; and
   an output driver configured to convert the compressed digital information into output voltages.

3. The method of claim 2, wherein the SFADC further comprises a cold digital amplifier, maintained at superconducting temperature, that is not an RFSQ element, but that is configured to buffer and condition the output voltages so that the output voltages may be used with room-temperature electronics.

4. The method of claim 3, further comprising the step of altering one or more of a bias, a delay, and a temperature of the cold digital amplifier to reduce one or more of the noise and the error.

5. The method of claim 2, further comprising the step of adjusting one or more of a bias and a delay line of the $\log_2(N)$ counter RSFQ element such that a bit error of the SFADC is corrected for a given input.

6. The method of claim 2, further comprising adjusting one or more of a bias and a temperature of a phase comparator RSFQ element if phase drift is detected at an output of the SFADC such that the N-channel phase comparator's comparison threshold is optimized for a given input.

7. The method of claim 2, further comprising:
   performing fast Fourier transform (FFT) of the output;
   using the FFT to analyze a power spectrum density (PSD) of the SFADC output to determine if certain internal components of the SFADC have mismatch or errors that appear as one or more of noise and harmonic spurs in the FFT; and
   identifying either the N-channel time interleaving element or the N-channel phase comparator as an element contributing noise if the SFADC output is nonlinear for input power multiples.

8. The method of claim 7, further comprising identifying the output driver or the cold digital amplifier as an element contributing noise if the SFADC output has harmonics that are fraction multiples of a sampling frequency.

9. The method of claim 8, further comprising identifying the $\log_2(N)$ counter as an RSFQ element contributing to error if bit errors are found at specific time intervals in a demodulated SFADC output of a digital waveform.

10. The method of claim 9, further comprising the step of adjusting a bias of the $\log_2(N)$ counter RSFQ element such that the bit errors of the SFADC are corrected for the digital waveform.

11. The method of claim 9, further comprising the step of adjusting a delay line of the $\log_2(N)$ counter RSFQ element such that the bit errors of the SFADC are corrected for the digital waveform input.

12. The method of claim 10, further comprising identifying the N-channel phase comparator RSFQ element as an RSFQ element contributing to error if phase drift is detected in the demodulated SFADC digital waveform output.

13. The method of claim 11, further comprising adjusting a temperature of the N-channel phase comparator RSFQ element if phase drift is detected in the demodulated SFADC digital waveform output such that the N-channel phase comparator's comparison threshold is optimized for the digital waveform input.

14. The method of claim 11, further comprising adjusting a bias of the N-channel phase comparator RSFQ element if phase drift is detected in the demodulated SFADC digital waveform output such that the N-channel phase comparator's comparison threshold is optimized for the digital waveform input.

15. The method of claim 1, wherein the SFADC is a successive approximation register (SAR) ADC that comprises four RSFQ elements as follows:
   a sample and hold element configured to sample input SFQ pulse values and hold the sampled input SFQ pulse values for more than two clock cycles;
   a comparator configured to measure a difference between the input SFQ pulses and reference SFQ pulses;

a SAR element configured to estimate an analog input signal based on an output of the comparator and store the estimated analog input signal in digital format; and a coarse digital to analog converter (DAC) element configured to convert the stored, digitally-formatted estimate of the analog input signal from the SAR element into the reference SFQ pulses.

16. A method for improving performance of a superconducting, flux-quantizing analog to digital converter (SFADC), comprising the following steps:

providing a digital waveform test signal as an input to the SFADC at an input terminal;

demodulating the digital waveform test signal with the SFADC so as to produce an output signal;

using digital signal processing techniques to identify any errors or noise in the output signal due to internal components of the SFADC; and altering one or more of a bias, a delay, and a temperature of a given internal component of the SFADC to calibrate the given internal component to reduce one or more of the noise and the error in the output signal.

17. The method of claim 16, wherein the step of using digital signal processing is performed at room temperature.

18. The method of claim 17, wherein digital signal processing techniques are used without establishing separate physical connection, apart from the input terminal, to individual internal components.

19. The method of claim 18, wherein the digital signal processing techniques are used while maintaining the SFADC at cryogenic temperatures.

20. The method of claim 19, wherein the SFADC is a phase-modulation-demodulation (PMD) ADC, and wherein the internal components comprise the following six rapid single flux quantum (RSFQ) elements:

an input flux interferometer configured to convert the digital waveform test signal into single flux quantum (SFQ) pulses;

a Josephson transmission line amplifier configured to buffer and condition the SFQ pulses;

an N-channel time interleaving element configured to copy the buffered and conditioned SFQ pulses into N number of channels with each channel having an integer-multiple time delay from each other that creates time interleaving;

an N-channel phase comparator configured to measure a phase of the SFQ pulses in each channel, and further configured to perform phase demodulation and to recover digital information from the SFQ pulses in each channel;

a $\log_2(N)$ counter configured to compress the digital information into less than N channels; and an output driver configured to convert the compressed digital information into output voltages.

* * * * *